US005538831A

United States Patent [19]

Oshima et al.

[11] Patent Number: 5,538,831

[45] Date of Patent: Jul. 23, 1996

[54] THERMAL TRANSFER FILM

[75] Inventors: Katsuyuki Oshima; Mikiko Kudo, both of Tokyo-to, Japan

[73] Assignee: Dai Nippon Printing Co., Ltd., Japan

[21] Appl. No.: 452,040

[22] Filed: May 26, 1995

[30] Foreign Application Priority Data

May 26, 1994 [JP] Japan .................................... 6-136575

[51] Int. Cl.$^6$ ............................ G03C 1/805; G03C 1/73; G03F 7/11

[52] U.S. Cl. .......................... 430/201; 430/200; 430/338; 430/271.1; 503/227

[58] Field of Search .................................... 430/200, 201, 430/271, 335; 503/227

[56] References Cited

FOREIGN PATENT DOCUMENTS

3/183593 8/1991 Japan .................................... 430/201

*Primary Examiner*—Richard L. Schilling

*Attorney, Agent, or Firm*—Parkhurst, Wendel & Burr

[57] ABSTRACT

There is provided a thermal transfer film comprising: a substrate film; a sublimable dye layer region comprised of at least one color layer; and a hot-melt ink layer region, the sublimable dye layer region and the hot-melt ink layer region being provided in parallel to each other on the substrate film, the hot-melt ink layer region comprising at least a release layer, a release protective layer, and a hot-melt ink layer laminated in that order on the substrate film, the hot-melt ink layer region being broader than one color layer in the sublimable dye layer region.

7 Claims, 2 Drawing Sheets

THERMAL TRANSFER FILM

BACKGROUND OF THE INVENTION

1. Field of the Invention

The present invention relates to a thermal transfer film comprising a substrate film and a sublimable dye layer, a hot-melt ink layer, and optionally a transferable protective layer region provided in parallel to one another on the substrate film. More particularly, the present invention relates to a thermal transfer film which can form durable images on an image-receiving object to provide an object, such as an identification (ID) card, having a transferred photograph-like image together with transferred information represented by letters, symbols and the like.

2. Background Art

Various thermal transfer recording systems are known in the art. One of them is a sublimation-type thermal recording system wherein a transfer sheet comprising a substrate film and, provided thereon, a dye layer containing a sublimable dye and a binder is prepared and the dye contained in the dye layer is sublimated (thermally transferred) by means of a thermal head, a laser beam, or the like in response to image information to carry out recording.

A hot-melt-type thermal recording system is also known wherein a thermal transfer film comprising a substrate film and, provided thereon, a hot-melt ink layer containing a colorant, such as a pigment, and a vehicle, such as wax, is prepared and the hot-melt ink layer is heated by the same heating means as described above to soften and transfer components of the ink layer to form an image.

The thermal transfer recording systems enable various images to be simply formed and, hence, have become utilized in prints wherein the number thereof may be relatively small, for example, in the preparation of identification (ID) cards and the like.

The preparation of ID cards and the like using the hot melt type thermal transfer film described just above is disadvantageous in that the formation of gradational images, such as a photograph-like image of a person's face, is difficult although monotonous images, such as letters and numerical values, can be easily formed.

On the other hand, the use of the sublimation dye transfer-type thermal transfer film can provide excellent gradational images such as a photograph-like image of a person's face. Images of letters, symbols, and the like formed by this thermal transfer film, however, lack in density and sharpness, making it impossible to form characters and bar codes, for OCR, readable by infrared radiation.

The use of the hot-melt-type thermal transfer film in combination with the sublimation-type thermal transfer film is considered as a method for solving the above problems. This method, however, involves a complicated operation. For this reason, as disclosed in Japanese Patent Laid-Open No. 453905/1991, a thermal transfer film has been developed which comprises a continuous substrate film and a sublimation-type dye layer and a hot-melt-type ink layer provided in parallel to each other on the substrate film. For this thermal transfer film, individual ink coating regions are formed to have the same area. Therefore, when an ID card with a portion for a photograph-like image of a person's face and a portion for information represented by letters, such as company names or personal names, occupying only a small proportion of the card is prepared using this thermal transfer film, problems occur such as prolonged printing time and high running cost.

In order to solve these problems, Japanese Patent Laid-Open No. 281989/1989 discloses a thermal transfer ink sheet comprising a sublimable dye layer region having a relatively smaller area and a hot-melt ink layer having a relatively larger area.

The hot-melt ink layer described in the above laid-open document, however, is a wax-based ink layer which has poor durability in respect of abrasion resistance, plasticizer resistance, and the like. The poor durability leads to problems of the disappearance of information represented by letters recorded together with a photograph-like image during use for a long period of time and the forgery of ID card because the information is easily rewritable.

Further, there are additional problems including that when an ID card is repeatedly put in and out of a purse or a card case, blurring of the photograph-like image of a person's face or fading occurs and that the image is blurred during use of an ID card for a long period of time due to an influence of a plasticizer or the like contained in a polyvinyl chloride card case.

Accordingly, an object of the present invention is to solve the above problems of the prior art and to provide a thermal transfer film which can simply form, in a short time and in a cost-effective manner, a gradational image and a monotonous image which can effectively prevent the forgery of recorded information.

SUMMARY OF THE INVENTION

It has now been found by the present inventors that the above object can be attained by a thermal transfer film comprising: a substrate film; a sublimable dye layer region comprised of at least one color layer; and a hot-melt ink layer region, the sublimable dye layer region and the hot-melt ink layer region being provided in parallel to each other on the substrate film, the hot-melt ink layer region comprising at least a release layer, a release protective layer, and a hot-melt ink layer laminated in that order on the substrate film, the hot-melt ink layer region being broader than one color layer in the sublimable dye layer region.

In a thermal transfer film comprising: a substrate film; a sublimable dye layer region comprised of at least one color layer; and a hot-melt ink layer region, the sublimable dye layer region and the hot-melt ink layer region being provided in parallel to each other on the substrate film, the hot-melt ink layer region being broader than one color layer in the sublimable dye layer region, since the hot-melt ink layer region comprises at least a release layer, a release protective layer, and a hot-melt ink layer laminated in that order on the substrate film, the thermal transfer film can provide a print having excellent durability in respect of abrasion resistance.

Further, since the hot-melt ink layer region has a larger area than one color layer in the sublimable dye layer region, when the thermal transfer film is used for ID card with a portion for a photograph-like image of a person's face and a portion for information represented by letters occupying only a small proportion of the card, the printing time required for sheet feed or the like can be reduced, because the dye layer region is provided only in a necessary region, and, at the same time, the running cost can be reduced.

Furthermore, when a transferable protective layer region is provided to have the same coating area as one color layer in the sublimable dye layer region, it becomes possible to easily form a protective layer in only the portion of a photograph-like image of a person's face in a cost-effective and efficient manner. Furthermore, when a transferable protective layer region is provided in the same coating area as the hot-melt ink layer region, a protective layer can be formed in the portion for information represented by letters as well as in the portion of a photograph-like image of a person's face.

DETAILED DESCRIPTION OF THE INVENTION

The present invention will now be described in more detail with reference to the accompanying drawings showing preferred embodiments of the present invention.

Figure 1:
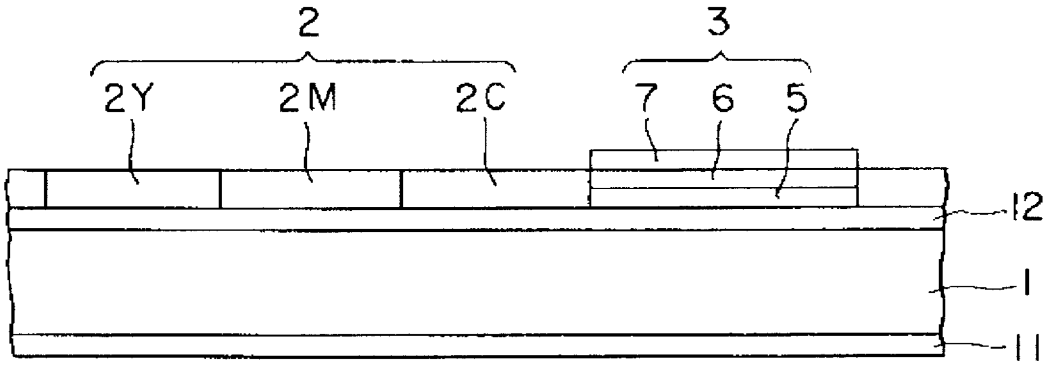
FIG. 1 is a diagrammatic cross-sectional view of an embodiment of the thermal transfer film of the present invention.
Figure 2:
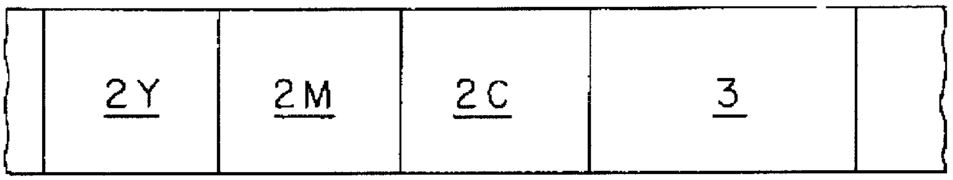
FIG. 2 is a diagrammatic plan view of the thermal transfer film of the present invention shown in FIG. 1.

FIG. 1 is a diagrammatic cross-sectional view of a preferred embodiment of the thermal transfer film of the present invention, and FIG. 2 is a plan view of the thermal transfer film shown in FIG. 1.

The thermal transfer film according to this embodiment comprises a substrate film 1 and a sublimable dye layer region 2 of sublimable dye layers 2Y, 2M, and 2C respectively containing yellow, magenta, and cyan dyes, and a hot-melt ink layer region 3 provided in parallel to each other on the substrate film 1. The hot-melt ink layer region 3 comprises a release layer 5, a release protective layer 6, and a hot-melt ink layer 7 laminated in that order on the substrate film.

Figure 3:
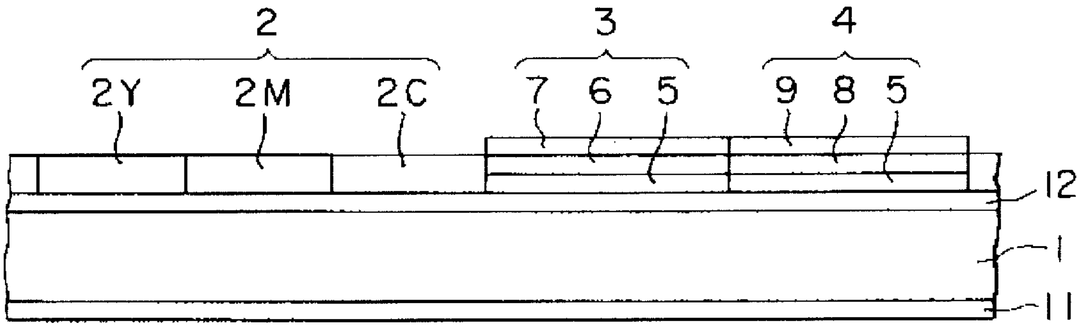
FIG. 3 is a diagrammatic cross-sectional view of another embodiment of the thermal transfer film of the present invention.

FIG. 3 is a thermal transfer film shown in FIG. 1 which further comprises a transferable protective layer region 4. The transferable protective layer region 4 comprises a release layer 5, a release protective layer 8, and an adhesive layer 9 laminated in that order on the substrate film.

Figure 4:
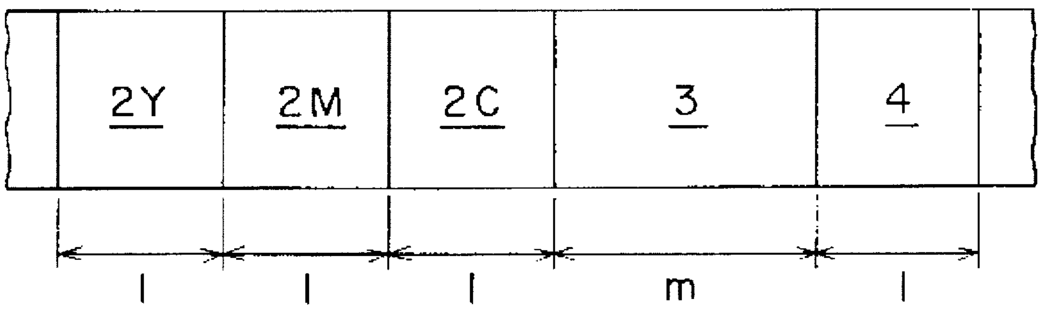
FIG. 4 is a diagrammatic plan view of a further embodiment of the thermal transfer film of the present invention.

FIG. 4 is a diagrammatic plan view of another preferred embodiment of the thermal transfer film of the present invention. In this embodiment, the transferable protective layer region 4 is provided to have the same coating area as one color layer 2Y.

Figure 5:
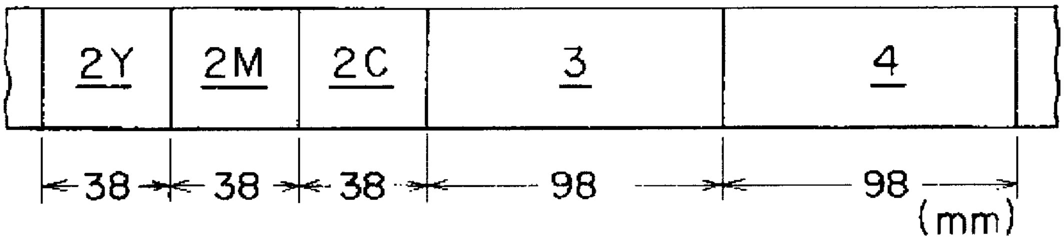
FIG. 5 is a diagrammatic plan view of a further embodiment of the thermal transfer film of the present invention.

FIG. 5 shows a further preferred embodiment of the thermal transfer film of the present invention wherein the transferable protective layer region 4 is provided to have the same coating area as the hot-melt ink layer region 3.

Figure 6:
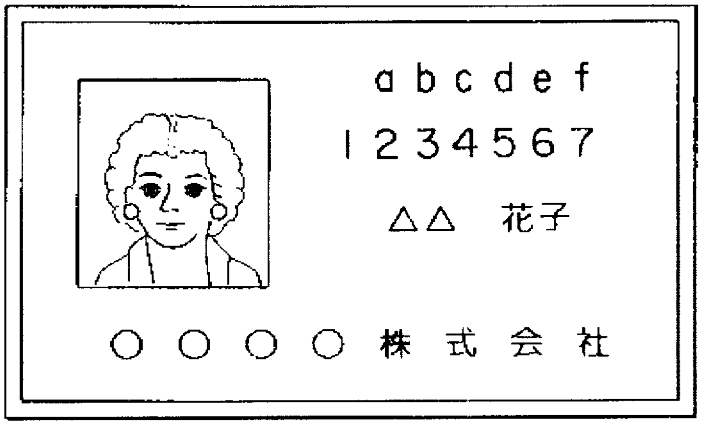
FIG. 6 is a diagrammatic view of an ID card prepared using the thermal transfer film shown in FIG. 5.

FIG. 6 shows an ID card formed by recording a photograph-like image of a person's face and information represented by letters on a card using the thermal transfer film shown in FIG. 5 and transferring the protective layer over the whole surface of the card.

In the drawings, numeral 11 denotes a heat-resistant slip layer which serves to prevent sticking of a thermal head of a printer to the thermal transfer film.

Numeral 12 denotes a primer layer which serves to improve the adhesion of the sublimable dye layer region 2 and the release layer 5 to the substrate film 1.

Materials for the thermal transfer film of the present invention and a process for producing the thermal transfer film will now be described.

The substrate film 1 used in the thermal transfer film of the present invention may be any conventional film having suitable heat resistance and strength, and examples thereof include 0.5 to 50 μm-thick, preferably about 3 to 10 μm-thick paper, various types of converted paper, and films of polyesters including polyethylene terephthalate, polystyrene, polypropylene, polysulfone, polyphenylene sulfide, polyethylene naphthalate, 1,4-polycyclohexylene dimethyl terephthalate, aramid, polycarbonate, polyvinyl alcohol, and cellophane. Among them, polyester films are preferred, and a polyethylene terephthalate film is particularly preferred. It is also preferred to provide an adhesive layer (a primer layer 12) on one or both sides of the film. The form of the substrate film is not particularly limited, and the substrate film may be in either a sheet form or a continuous film form.

Preferably, a heat-resistant slip layer, to which heat-resistant slip property and releasability have been imparted, is provided on the side (back side) of the substrate film remote from the dye layer from the viewpoint of preventing the substrate film from fusing to a thermal head, improving the carriability of the thermal transfer film, and avoiding the adhesion of the back side to the surface of the colorant layer at the time of taking up the composite thermal transfer film of the present invention in a roll form. The heat-resistant slip layer may be formed of, for example, a release agent, such as a curable silicone oil, a curable silicone wax, a silicone resin, a fluororesin, or an acrylic resin. The heat-resistant slip layer may be formed of a material prepared by reacting a thermoplastic resin having —OH or —COOH group with a compound having two or more amino groups or a diisocyanate or a triisocyanate to cure the resin through crosslinking.

The slip property can be further improved by incorporating a phosphoric ester surfactant or a filler having cleavability, such as talc or mica, into the heat-resistant slip layer.

The sublimable dye layer 2 provided in the thermal transfer film of the present invention is a layer of a dye held by any suitable binder.

The dye usable in the sublimable dye layer is one which can be melt-, dispersion-, or sublimation-transferred upon heating. Although all the dyes used in the conventional thermal transfer film may be effectively used in the present invention, the dye used is preferably selected by taking into consideration hue, lightfastness, and solubility in the binder. Preferred examples of the dye include diarylmethane dyes; triarylmethane dyes; thiazole dyes; methine dyes, such as merocyanine; azomethine dyes, exemplified by indoaniline, acetophenone azomethine, pyrazolone azomethine, imidazole azomethine, imidazoazomethine, and pyridone azomethine; xanthene dyes; oxazine dyes; cyanomethylene dyes exemplified by dicyanostyrene and tricyanostyrene; thiazine dyes; azine dyes; acridine dyes; benzene azo dyes; azo dyes exemplified by pyridone azo, thiophene azo, isothiazole azo, pyrrole azo, pyrazole azo, imidazole azo, thiadiazole azo, triazole azo, and disazo dyes; spiropyran dyes; indolinospiropyran dyes; fluoran dyes; rhodamine lactam dyes; naphthoquinone dyes; anthraquinone dyes; and quinophthalone dyes. Specific examples of dyes are as follows:

C.I. (color index) Disperse Yellow 51, 3, 54, 79, 60, 23, 7, and 141;
C.I. Disperse Blue 24, 56, 14, 301, 334, 165, 19, 72, 87, 287, 154, 26, and 354;
C.I. Disperse Red 135, 146, 59, 1, 73, 60, and 167;
C.I. Disperse Orange 149;
C.I. Disperse Violet 4, 13, 26, 36, 56, and 31;
C.I. Solvent Yellow 56, 14, 16, 29, and 201;
C.I. Solvent Blue 70, 35, 63, 36, 50, 49, 111, 105, 97, and 11;
C.I. Solvent Red 135, 81, 18, 25, 19, 23, 24, 143, 146, and 182;
C.I. Solvent Violet 13;
C.I. Solvent Black 3; and
C.I. Solvent Green 3.

For example, dyes usable in the present invention are cyan dyes including Kayaset Blue 714 (Solvent Blue 63, manufactured by Nippon Kayaku Co., Ltd.), Foron Brilliant Blue S-R (Disperse Blue 354, manufactured by Sandoz K. K.), and Waxoline AP-FW (Solvent Blue 36, manufactured by ICI Japan); magenta dyes including MS-REDG (Disperse Red 60, manufactured by Mitsui Toatsu Chemicals, Inc.) and Macrolex Violet R (Disperse Violet 26, manufactured by Bayer), and yellow dyes including Foron Brilliant Yellow S-6GL (Disperse Yellow 231, manufactured by Sandoz K. K.) and Macrolex Yellow 6G (Disperse Yellow 201, manufactured by Bayer).

The binder resin for holding the above dye may be any conventional one, and examples of such a binder resin include cellulosic resins, such as ethyl cellulose, ethylhydroxy cellulose, hydroxypropyl cellulose, methyl cellulose, and cellulose acetate, vinyl resins, such as polyvinyl alcohol, polyvinyl acetate, polyvinyl butyral, and polyvinyl acetal, acrylic resins, such as poly(meth)acrylate and poly(meth)acrylamide, polyurethane resins, polyamide resins, and polyester resins. These resins may be used alone or as a mixture of two or more.

Among the above resins, polyvinyl butyral and polyvinyl acetal are preferred from the viewpoint of dye transfer and storage stability of the film.

Further, in the present invention, the following releasable graft copolymer may be used as a release agent or a binder instead of the above binder. The releasable graft copolymer may be prepared by graft-polymerizing at least one releasable segment selected from a polysiloxane segment, a fluorocarbon segment, a fluorohydrocarbon segment, and a long-chain alkyl segment onto a main chain of a polymer.

The graft copolymer prepared by grafting a polysiloxane segment onto a main chain of polyvinyl acetal resin is particularly preferred.

The above graft copolymer may be prepared, for example, by reacting a polysiloxane having a functional group with a diisocyanate to prepare a silicone chain for grafting and grafting the silicone chain onto polyvinyl acetal. More specifically, for example, a silicone-grafted polyvinyl acetal resin may be prepared by reacting hexamethylene diisocyanate with a dimethylpolysiloxane having at its one end a hydroxyl group in a solvent of a 1:1 mixture of methyl ethyl ketone and methyl isobutyl ketone in the presence of a tin-base catalyst (for example, dibutyltin) at a reaction temperature of about 0.01° to 100° C. to prepare a silicone chain for grafting and then reacting the silicone chain with polyvinyl acetal resin in a solvent of a 1:1 mixture of methyl ethyl ketone and methyl isobutyl ketone.

When the graft copolymer is used as a release agent for the dye layer, the content of the releasable segment in the release agent is preferably such that the content of the releasable segment in the graft copolymer is in the range of from 10 to 80% by weight. When the content of the releasable segment is excessively low, the releasability is unsatisfactory, while when it is excessively high, the miscibility with the binder is lowered, causing a problem associated with dye transfer or the like. When the above release agents are added to the dye layer, they may be used alone or as a mixture of two or more. The amount of the release agent added is preferably 1 to 40 parts by weight based on 100 parts by weight of the binder resin.

When the amount of the release agent added is excessively small, the release effect is unsatisfactory, while when it is excessively large, deterioration in the transfer of the dye from the dye layer or the coating strength and problems of discoloration of the dye contained in the dye layer and storage stability of the thermal transfer film unfavorably occur.

On the other hand, when the graft copolymer is used as a binder for the dye layer, the content of the releasable segment in the binder resin is preferably such that the content of the releasable segment in the graft copolymer is 0.5 to 40% by weight. When the content of the releasable segment is excessively low, the releasability of the dye layer is unsatisfactory, while when it is excessively large, deterioration in the transfer of the dye from the dye layer or the coating strength and problems of discoloration of the dye contained in the dye layer and storage stability of the thermal transfer film unfavorably occur.

The sublimable dye layer region 2 may be formed by coating the above substrate film with a solution of the above dye and binder resin and optionally various additives dissolved in a suitable solvent or a dispersion of the above components in a suitable organic solvent or water by gravure printing, screen printing, or reverse roll coating using a gravure plate and then drying the resultant coating to form a dye layer.

In this case, the dye layer may be provided by single coating. Alternatively, it may be provided by double coating. The double coating can enhance the dye coverage per unit area. Further, the provision of a layer containing the above releasable resin as the outermost layer of the dye layer can prevent heat fusing even when printing is carried out on an image-receiving object lean in a releasable component, such as a plastic card.

The thickness of the dye layer thus formed is suitably 0.2 to 5.0 μm, preferably 0.4 to 2.0 μm.

Printing may be monochrome printing. However, multicolor printing of three colors of yellow, magenta, and cyan or four colors of the above three colors and additionally black, which can form a color image, is preferred from the viewpoint of the object of the present invention.

In the present invention, a hot-melt ink layer region 3 having a larger coating area than the above one color layer is provided adjacent to the sublimable dye layer region 2. The hot-melt ink layer region 3 is characterized by comprising a release layer 5, a release protective layer 6, and a hot-melt ink layer 7 formed in that order on the substrate film 1. The release layer 5 may be formed of a release agent, which can form an ink layer 7 described below, such as wax, silicone wax, silicone resin, fluororesin, acrylic resin, cellulosic resin, vinyl chloride/vinyl acetate copolymer, nitrocellulose, polyvinyl alcohol resin, or urethane resin. These release agents may be used alone or as a mixture of two or more. The release layer 5 may be formed in the same manner as described above in connection with the dye layer region 2, and a thickness of about 0.1 to 5 μm suffices for the release layer 5. When the formation of a matte print is desired or when the transferred protective layer is desired to be matte, various particles can be incorporated into the release layer. The release protective layer 6 provided on the release layer 5 may be formed of preferably a resin having excellent transparency, abrasion resistance, chemical resistance, and other properties, such as acrylic resin, polyester resin, or polyurethane resin. It may be formed by preparing a solution of a suitable resin in the same manner as described above in connection with the formation of the dye layer region 2 and coating the solution in a thickness of 0.2 to 10 μm by the above coating or printing method. In the formation of the release protective layer 6, it is also possible to add a filler, such as silica or alumina, for the purpose of improving the releasability at the time of transfer. In addition, a wax, such as polyethylene wax, may be incorporated into the release protective layer 6 in order to improve the abrasion resistance and the slip property.

The hot-melt ink layer 7 provided on the release protective layer 6 comprises a colorant and a vehicle and optionally suitably additives.

The colorant is preferably an organic or an inorganic pigment or dye which has good properties as a recording material, for example, a satisfactory color density and resistance to light, heat, temperature and the like sufficient to prevent fading. Although cyan, magenta, yellow, and the like may be used as the colorant, a black colorant which can provide a print of sharp letters and symbols with high density is preferred from the viewpoint of the object of the present invention.

The vehicle is composed mainly of a wax which is used as a mixture with a drying oil, a resin, a mineral oil, cellulose, or a rubber derivative.

Waxes usable as the vehicle include microcrystalline wax, carnauba wax, and paraffine wax. It is also possible to use other various waxes such as Fischer-Tropsh wax, various low-molecular weight polyethylene, Japan wax, beeswax, spermaceti, insect wax, wool wax, shellac wax, candelilla wax, petrolatum, partially modified wax, fatty acid esters, and fatty acid amides. In the present invention, however, a resin mixture of a vinyl chloride/vinyl acetate copolymer resin or an acrylic resin with at least one of a chlorinated rubber, a vinyl chloride/vinyl acetate copolymer resin, and a cellulosic resin is still preferably used as a binder for the black ink layer from the viewpoint of the adhesion to a card and scratch resistance.

The hot-melt ink layer 7 may be formed on the release protective layer 6 provided on the substrate film 1 by hot-melt coating or other conventional coating methods such as hot lacquer coating, gravure coating, gravure reverse coating, or roll coating. The thickness of the ink layer should be determined by taking into consideration the balance of necessary density and heat sensitivity. In general, it is preferably in the range of from 0.2 to 10 μm.

An area sufficient for the formation of a gradational image region for a photograph-like image of a person's face, a mark, or the like in an identification card suffices for the sublimable dye layer region 2. On the other hand, for the hot-melt ink layer region, when an organization, name, code No., and other information on the owner of the card are described in the lower half part of the card as in the case of the conventional ID cards, the sublimable dye layer region preferably has substantially the same width as the lateral width of the card so as to sufficiently cover the whole region where the above information is described, although this varies depending upon the contemplated print.

The coating width of the sublimable dye layer is about 5 to 70 mm, preferably 20 to 60 mm. On the other hand, the coating width of the hot-melt ink layer region is about 70 to 150 mm, preferably about 80 to 110 mm.

In the thermal transfer film of the present invention, a transferable protective layer region 4 is preferably provided adjacent to the sublimable dye layer region 2 and the hot-melt layer region 3.

The transfer of the protective layer onto the resultant image can improve various types of durability, such as abrasion resistance, contamination resistance, and weather resistance.

Preferably, the transferable protective layer region 4 is formed by laminating a release layer 5, a release protective layer 8, and an adhesive layer 9 in that order onto the substrate film. This construction improves the transferability of the protective layer.

The release layer 5 may be formed by coating a coating solution mainly composed of a wax, silicone wax, a silicone resin, a fluororesin, an acrylic resin, polyvinyl alcohol, or the like by any conventional method, such as gravure coating or gravure reverse coating, and drying the resultant coating. A thickness of about 0.1 to 2 μm suffices for the release layer.

When the protective layer is desired to be matte in a print after transfer, it is possible to incorporate various particles into the release layer or to use a substrate film with the surface thereof on the side of the release layer being matte-finished.

The provision of the release layer may be omitted when the releasability of the release protective layer and the substrate film is good.

The release protective layer 8 in the transferable protective layer region 4 according to the present invention may be formed of a polyester resin, a polystyrene resin, a vinyl chloride/vinyl acetate copolymer resin, an acrylic resin, a polyurethane resin, an acrylic urethane resin or the like, which is known as a resin for forming a protective layer, or these resins modified with silicone or a mixture of the above resins. In the present invention, however, it is preferably formed of an ionizing radiation-cured resin because of its excellent plasticizer resistance and scratch resistance.

The ionizing radiation-cured resin is prepared by exposing a polymer or an oligomer having in its structure a radical polymerizable double bond to an ionizing radiation to cause polymerization crosslinking. In this case, if necessary, a photopolymerization initiator may be added, and the polymerization crosslinking can be carried out by application of an electron beam or ultraviolet light. Any of the conventional ionizing radiation-curable resins may be used in the present invention without particular limitation.

Examples of the radical polymerizable monomer include acrylic esters, methacrylic esters, acrylamides, methacrylamides, allyl compounds, vinyl ethers, vinyl esters, vinyl heterocyclic compounds, N-vinyl compounds, styrene, acrylic acid, methacrylic acid, crotonic acid, and itaconic acid, and examples of the polyfunctional monomer include diethylene glycol diacrylate, diethylene glycol dimethacrylate, triethylene glycol diacrylate, triethylene glycol dimethacrylate, tetraethylene glycol diacrylate, tetraethylene glycol dimethacrylate, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, tris(β-acryloyloxy ethyl) isocyanurate, and tris(β-methacryloyloxy ethyl) isocyanurate.

In the case of ultraviolet irradiation, a compound which can generate radicals upon ultraviolet irradiation, for example, a benzoether compound, such as benzoquinone, benzoin or benzoin methyl ether, a halogenated acetophenone compound, or a diacetyl compound, may be used as a sensitizer in an amount of about 1 to 20% by weight based on the radical polymerizable monomer.

If necessary, a cellulosic resin, such as ethyl cellulose, a polyester resin, a polyurethane resin, an acrylic resin, a rosin ester resin, a rubbery resin, such as a cyclized rubber, or the like may be incorporated into the ionizing radiation-curable resin from the viewpoint of improving the flexibility, adhesion, and other properties.

Further, although the above resins have excellent transparency, they tend to form a relatively tough coating, so that, in some cases, the releasability of the protective layer at the time of transfer is unsatisfactory. For this reason, the ionizing radiation-cured resin layer preferably contains a relatively large amount of particles having high transparency. These particles include inorganic particles, such as finely divided silica, alumina, calcium carbonate, talc, and clay, and organic fillers, such as acrylic resin, polyester resin, melamine resin, epoxy resin, and polyethylene resin, the above particles having a particle diameter of about 0.01 to 50 μm.

When particles of silica, alumina, and the like are used, they may have been treated with a silane coupling agent in order to improve its miscibility with the ionizing radiation-cured resin.

Examples of the silane coupling agent include γ-methacryloxypropyl trimethoxy silane, γ-methacryloxypropyl methyldimethoxy silane, γ-methacryloxypropyl dimethylmethoxy silane, γ-methacryloxypropyl triethoxy silane, γ-methacryloxypropyl dimethylethoxy silane, γ-acryloxypropyl trimethoxy silane, γ-acryloxypropyl dimethylmethoxy silane, γ-acryloxypropyl triethoxy silane, γ-acryloxypropyl methyldiethoxy silane, γ-acryloxypropyl dimethylethoxy silane, and vinylethoxysilane.

The particles of the above organic filler, treated silica, and other fillers having high transparency are incorporated in an amount of preferably 5 to 50 parts by weight based on 100 parts by weight of the ionizing radiation-cured resin. When the amount is smaller than the above range, the releasability of the protective layer at the time of transfer is unsatisfactory, while when it is larger than the above range, the layer unfavorably lacks in transparency for use as the protective layer.

Further, the addition of a wax, a lubricant, an ultraviolet absorber, an antioxidant and/or a fluorescent brightening agent as other additives can improve the slip property, gloss, lightfastness, weather resistance, whiteness, and other properties of various images to be covered with the protective layer.

The ionizing radiation-cured resin layer may be formed by optionally adding suitable solvent and additives to the ionizing radiation-curable resin comprising the above components, adjusting the viscosity or the like to prepare an ink, coating the ink on a substrate film by known means, such as gravure coating, gravure reverse coating, or roll coating, and drying and curing the resultant coating. The thickness of the cured resin layer is preferably about 1 to 10 μm.

A radiation such as ultraviolet light or electron beam may be used to cure the ionizing radiation-curable resin. Conventional methods may be used for the radiation irradiation. For example, in the case of curing by electron beam irradiation, use may be made of an electron beam having an energy of 50 to 1,000 KeV, preferably 100 to 300 KeV, emitted from various electron beam accelerators, such as a Cockcroft-Walton accelerator, a Van de Graaff accelerator, a resonance transformer accelerator, an insulated core transformer accelerator, a linear accelerator, an electrocurtain accelerator, a Dynamitron accelerator, and a high-frequency accelerator, and in the case of curing by ultraviolet light irradiation, use may be made of ultraviolet light emitted from light sources such as ultra-high pressure mercury lamps, high pressure mercury lamps, low pressure mercury lamps, carbon arcs, xenon arcs, and metal halide lamps. The curing by ionizing radiation irradiation may be carried out immediately after the formation of the curable resin layer or alternatively after the formation of all the layers.

According to another embodiment of the transferable protective layer region 4 of the present invention, an ultraviolet-screening layer 13 is preferably provided from the viewpoint of improving the lightfastness of the print.

The ultraviolet-screening layer may be provided between the release layer 5 and the release protective layer 8 or between the release protective layer 8 and the adhesive layer 9. In general, however, the provision of the ultraviolet-screening layer in the latter position is preferred.

The ultraviolet-screening layer used in the present invention preferably contains a resin with a reactive ultraviolet absorber chemically bonded thereto.

The reactive ultraviolet absorber may be one prepared by introducing, for example, an addition-polymerizable double bond of a vinyl, acryloyl, or methacryloyl group or an alcoholic hydroxyl, amino, carboxyl, epoxy, or isocyanate group into a nonreactive ultraviolet absorber, for example, a conventional organic ultraviolet absorber, such as a salicylate, benzophenone, benzotriazole, substituted acrylonitrile, nickel chelate, or hindered amine nonreactive ultraviolet absorber. For example, reactive ultraviolet absorbers represented by the following structural formulae may be used.

Further, the ionizing radiation-cured resin layer may also be formed of a resin with the above reactive ultraviolet absorber chemically bonded thereto.

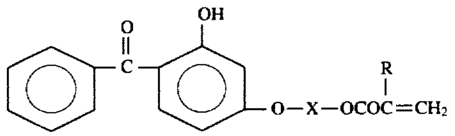

where R is H or $CH_3$ and X is $-CH_2CH_2-$ or $-CH_2CH(OH)CH_2-$; and

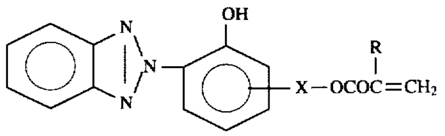

wherein R is H or $CH_3$ and X is $-CH_2CH_2-$ or $-CH_2CH(OH)CH_2-$.

Various methods may be used to chemically immobilize the reactive ultraviolet absorber to the thermoplastic resin. For example, a resin component of a conventional monomer, oligomer, or reactive polymer may be radical-polymerized with the above reactive ultraviolet absorber to prepare a copolymer.

When the reactive ultraviolet absorber has a hydroxyl, amino, carboxyl, epoxy, or isocyanate group, the chemical immobilization may be carried out by reacting the reactive ultraviolet absorber with a thermoplastic resin having a reactive group optionally in the presence of a catalyst with the aid of heat or the like to immobilize the reactive ultraviolet absorber to the thermoplastic resin.

Monomers copolymerizable with the reactive ultraviolet absorber include the following compounds:

methyl (meth)acrylate, ethyl (meth)acrylate, propyl (meth)acrylate, butyl (meth)acrylate, isobutyl (meth)acrylate, tert-butyl (meth)acrylate, isodecyl (meth)acrylate, lauryl (meth)acrylate, lauryltridecyl (meth)acrylate, tridecyl (meth)acrylate, cerylstearyl (meth)acrylate, stearyl (meth-)acrylate, ethylhexyl (meth)acrylate, octyl (meth)acrylate, cyclohexyl (meth)acrylate, benzyl (meth)acrylate, methacrylic acid, hydroxyethyl (meth)acrylate, hydroxypropyl (meth)acrylate, dimethylaminoethyl (meth)acrylate, diethylaminoethyl (meth)acrylate, tert-butylaminoethyl (meth-)acrylate, glydicyl (meth)acrylate, tetrahydrofurfuryl (meth-)acrylate, ethylene di(meth)acrylate, diethylene glycol (meth)acrylate, triethylene glycol di(meth)acrylate, tetraethylene glycol di(meth)acrylate, decaethylene glycol (meth-)acrylate, poentadecaethylene (meth)acrylate, pentacontahectaethylene (meth)acrylate, butylene di(meth)acrylate, allyl (meth)acrylate, trimethylolpropane tri(meth)acrylate, hexanediol di(meth)acrylate, tripropylene glycol di(meth)acrylate, pentaerythritol tetra(meth)acrylate, pentaerythritol hexa(meth)acrylate, dipentaerythritol hexa(meth)acrylate, 1,6-hexanediol di(meth)acrylate, neopentylglycol penta(meth)acrylate, and phosphazene hexa(meth)acrylate.

The above compounds may be used in not only a monomer form but also an oligomer form. Further, it is also possible to use polyester acrylates, epoxyacrylates or other acrylic reactive polymers which are polymers of the above compounds or derivatives thereof.

The monomers, oligomers, and acrylic reactive polymers may be used alone or as a mixture of two or more.

A thermoplastic copolymer resin with a reactive ultraviolet absorber chemically bonded thereto can be prepared by copolymerizing the above monomer, oligomer, or acrylic reactive polymer of a thermoplastic resin with a reactive ultraviolet absorber. The content of the ultraviolet absorber in the copolymer resin is preferably 10 to 90% by weight, still preferably 30 to 70% by weight. When it is smaller than the above range, it is difficult to impart satisfactory weather resistance, while it is larger than the above range, problems occur such as sticking at the time of coating or blurring of a dye image upon transfer onto the image.

The molecular weight of the copolymer resin is preferably about 5000 to 250,000, still preferably about 9000 to 30000. When the molecular weight is less than 5000, the coating strength is poor, while when it exceeds 250,000, the releasability of the protective layer at the time of transfer by means of a thermal head or the like becomes poor.

Although one example of the thermoplastic resin with an ultraviolet absorber bonded thereto by copolymerization has been described above, the copolymer resin of the present invention is not limited to this example only.

Further, the thermoplastic resin with an ultraviolet absorber bonded thereto by copolymerization may be used in combination with conventional ultraviolet absorbers, for example, organic ultraviolet absorbers, such as benzophenone, benzotriazole, salicylic ester, and hindered amine ultraviolet absorbers, and inorganic ultraviolet absorbers, such as titanium oxide, zinc oxide, and cerium oxide.

In the formation of the ultraviolet-screening layer on the ionizing radiation-cured resin layer, a primer layer may be formed on the ionizing radiation-cured resin layer when the adhesion between the ultraviolet-screening layer and the ionizing radiation-cured resin layer is poor.

The primer layer may be formed of an acrylic resin, such as polymethyl methacrylate or polyethyl methacrylate, or other resins. The thickness thereof is preferably in the range of from 0.1 to 5 μm.

The adhesive layer 8 which serves to effectively transfer the protective layer will now be described.

In the transferable protective layer region, the adhesive layer is formed as the outermost layer, for example, using a solution of a resin having a good adhesion in a hot state, such as acrylic resin, a vinyl chloride resin, a vinyl acetate resin, a vinyl chloride/vinyl acetate copolymer resin, a polyester resin, or a polyamide resin, by the same method as described above. The thickness of the adhesive layer may be in the range of from 0.1 to 5 μm.

If the adhesion between the ionizing radiation-cured resin layer and the adhesive layer is poor, it is possible to provide a primer layer.

The primer layer may be formed of an acrylic resin such as polymethyl methacrylate and polyethyl methacrylate. Polymethyl methacrylate is preferred from the viewpoint of coatability and plasticizer resistance of the image.

The thickness of the primer layer is preferably in the range of from about 0.1 to 5 μm.

The provision of the primer layer can improve the adhesion between the ionizing radiation-cured layer and the adhesive layer and, at the same time, can prevent troubles including that the release layer and the ionizing radiation-cured resin layer are strongly bonded to each other due to mixing of components constituting both the layers, making it difficult for the protective layer to be released from the substrate film.

An area sufficient for covering a gradational image region, which is likely to cause problems, such as fading by abrasion or ultraviolet light, suffices for the transferable protective layer region 4. In this case, the coating width of the transferable protective layer region 4 may be equal to or larger than that of the one color layer.

Also for the hot-melt ink layer region, a protective layer may be transferred onto an image in order to enhance the durability of the image. In this case, the thermal transfer protective layer region 24 preferably has a coating width substantially equal to the hot-melt ink layer region.

The coating width of the sublimable dye layer is preferably about 5 to 70 mm, still preferably 20 to 40 mm. On the other hand, the coating width of the hot-melt ink layer region and the transferable protective layer region is preferably about 70 to 150 mm, still preferably about 80 to 110 mm.

In the present invention, an image may be formed on a plastic card formed of a dyable resin receptive to a sublimable dye or an image-receiving sheet comprising a substrate film bearing thereon a dye-receptive layer. Alternatively, an image may be formed using an undyable material.

In this case, prior to the provision of the sublimable dye layer region 2, a transferable receptive layer region may be formed using a resin for a receptive layer described below. The provision of the transferable receptive layer region enables a receptive layer to be formed, prior to recording, on paper having low dyability or a plastic card having a low dyability, such as ABS resin, widening the range of objects on which an image can be transferred.

Image-receiving objects on which an image may be formed using the thermal transfer film of the present invention include plastic cards or films such as cards or films of polyester, polyvinyl chloride, vinyl chloride/vinyl acetate copolymer, polycarbonate resins. Among them, the vinyl chloride/vinyl acetate copolymer resin can advantageously eliminate the need of forming a receptive layer because it as such has dyability.

When plastic cards or films of the above resins are substantially undyable with a sublimable dye, the dyability of the plastic cards or films may be regulated by incorporating a plasticizer or the like into the resin.

Other usable image-receiving objects include plastic films and papers provided with a dye-receptive layer and woven and nonwoven fabrics of polyester fibers, polyamide resins, polypropylene fibers, vinylon fibers, or the like. The dye-receptive layer may be formed of any conventional receptive layer resin for sublimation-type transfer recording. A vinyl resin, a polycarbonate resin, a polyester resin, and a polyvinyl acetal resin are particularly preferred because they can receive a sublimable dye and hold the resultant image.

When the thermal transfer film of the present invention is used for the formation of an image on a card, the card may previously have an emboss, a writable layer for signature, an IC memory, a magnetic layer, a print, and the like. Alternatively, an emboss, a writable layer for signature, and IC memory, a magnetic layer, and the like may be provided after transfer of the protective layer.

The thermal transfer film of the present invention is put on top of the above image-receiving object so as for the sublimable dye layer region to face the image-receiving object, and a desired color image is formed based on image information by heating means such as a thermal head and a laser beam. Then, the hot-melt ink layer is put on top of the object followed by printing of desired letters, symbols, and the like in the same manner as described above. Thereafter, the transferable protective layer region is transferred onto the resultant image. In this case, a thermal head may be used as in the above case. Alternatively, use may be made of a hot stamper, a hot roll, a line heater, an iron, or the like.

The protective layer may be transferred over the whole surface of the formed image or alternatively transferred to form a transferred protective layer having a desired shape.

EXAMPLES

The present invention will now be described in more detail with reference to the following examples. In the following description, "parts" or "%" are by weight unless otherwise specified.

Further, in the following examples of the present invention, the shorter direction of the thermal transfer film is called "length" with the longer direction being called "width."

EXAMPLE 1

An ink, for a heat-resistant slip layer, comprising the following composition was gravure-coated at a coverage on a dry basis of 1.0 $g/m^2$ on one side of a 6 μm-thick continuous film of polyethylene terephthalate (Lumirror, manufactured by Toray Industries, Inc.; length 8 cm), and the resultant coating was dried to form a heat-resistant slip layer which was then heated and aged at 60° C. for 5 days in an oven to cure the slip layer.

| [Ink for heat-resistant slip layer> | |
|---|---|
| Polyvinyl butyral resin (S-lec BX-1, manufactured by Sekisui Chemical Co., Ltd.) | 3.6 parts |
| Polyisocyanate (Burnock D750, manufactured by Dainippon Ink and Chemicals, Inc.) | 8.4 parts |
| Phosphoric ester surfactant (Plysurf A208S, manufactured by Dai-Ichi Kogyo Seiyaku Co., Ltd.) | 2.8 parts |
| Talc (Microace P-3, manufactured by Nippon Talc Co., Ltd.) | 0.6 part |
| Toluene/methyl ethyl ketone (1/1) | 190 parts |

Thereafter, color inks having the following compositions were gravure-coated on the surface of the film remote from the heat-resistant slip layer, and the resultant coatings were dried to form sublimable dye layers. In this case, three sets of sublimable dye layer regions were formed at intervals of 10 cm. Each set consisted of sublimable dye layers of three colors with each sublimable dye layer having a size of 8 cm in length and 4 cm in width.

| <Yellow ink> | |
|---|---|
| Dye (FORON BRILLIANT YELLOW S-6GL) | 5.5 part |
| Polyvinyl acetoacetal regin (KS-5, manufactured by Sekisui Chemical Co. , Ltd. | 4.5 parts |
| Polyethylene wax | 0.1 part |
| Toluene/methyl ethyl ketone (1/1) | 89 parts |

Magenta ink

The composition was the same as that of the yellow ink, except that a magenta dye (1.5 parts of MS RED-G and 2.0 parts of MACROLEX RED VIORET R) was used instead of the yellow dye.

Cyan ink

The composition was the same as that of the yellow ink, except that a cyan dye (Kayaset Blue 714) was used instead of the yellow dye.

Then, an ink for a release layer was coated by means of a gravure coater at a coverage of 1.0 $g/m^2$ on a dry basis on an area with no dye layer formed thereon, and the resultant coating was dried to form a release layer.

| <Ink for release layer> | |
|---|---|
| Polyurethane resin (Hydran AP-40, manufactured by Dainippon Ink and Chemicals, Inc.) | 70 parts |
| Polyvinyl alcohol (Gosenol C-500, manufactured by Nippon Synthetic Chemical Industry Co., Ltd.) | 30 parts |
| Fluorescent whitening agent (Uvitex C.F., manufactured by Ciba-Geigy) | 0.5 part |
| Water/ethanol (2/1) | 300 parts |

Then, the following ink for a release protective layer was gravure-coated adjacent to the cyan dye layer at a coverage on a dry basis of 1.0 $g/m^2$, and the resultant coating was dried to form a release protective layer having a size of 8 cm in length and 10 cm in width. Thereafter, the following ink for a hot-melt ink layer was gravure-coated on the release protective layer at a coverage on a dry basis of 1.0 $g/m^2$, and the resultant coating was dried to form a hot-melt ink layer having the same size as the release protective layer. Thus, a hot-melt ink layer region was formed.

| <Ink for releasable protective layer> | |
|---|---|
| Acrylic resin (ER-85, manufactured by Mitsubishi Rayon Co., Ltd.) | 88 parts |
| Polyethylene wax | 11.5 parts |
| Polyester | 0.5 part |
| Fluorescent whitening agent (Uvitax O.B., manufactured by Ciba-Geigy) | 0.5 part |

-continued

| | |
|---|---|
| Toluene/methyl ethyl ketone (1/1) | 300 parts |
| <Ink for hot-melt ink layer> | |
| Vinyl chloride/vinyl acetate copolymer resin | 60 parts |
| Carbon black | 40 parts |
| Toluene/methyl ethyl ketone (1/1) | 200 parts |

EXAMPLE 2

The procedure of Example 1 was repeated. Thereafter, the following ink for an ionizing radiation-cured resin layer was gravure-coated adjacent to the hot-melt ink layer region at a coverage on a dry basis of 2.0 g/$m^2$, and the resultant coating was dried to form an ionizing radiation-curable resin layer having a size of 8 cm in length and 10 cm in width. Thereafter, the following ink for a primer layer was gravure-coated on the ionizing radiation-curable resin layer at a coverage on a dry basis of 1.0 g/$m^2$, and the resultant coating was dried to form a primer layer having the same size as the ionizing radiation-curable resin layer.

| | |
|---|---|
| <Ink for ionizing radiation-cured resin layer> | |
| Dipentaerythritol hexaacrylate | 10 parts |
| Polymethyl methacrylate | 20 parts |
| Silica treated with silane coupling agent | 3 parts |
| Polyethylene wax | 1.5 parts |
| Fluorescent whitening agent (Uvitex O.B., manufactured by Ciba-Geigy) | 0.15 part |
| Toluene/methyl ethyl ketone (1/1) | 70 parts |
| <Ink for primer layer> | |
| Polymethyl methacrylate | 30 parts |
| Fluorescent whitening agent (Uvitex O.B., manufactured by Ciba-Geigy) | 0.15 part |
| Toluene/methyl ethyl ketone (1/1) | 70 parts |

Thereafter, the following ink for an adhesive layer was gravure-coated on the primer layer at a coverage on a dry basis of 1.0 g/$m^2$, and the resultant coating was dried to form an adhesive layer. Thus, a transferable protective layer region was formed.

| <Ink for adhesive layer> | |
|---|---|
| Vinyl chloride/vinyl acetate copolymer resin (#1000 ALK, manufactured by Denki Kagaku Kogyo K.K.) | 30 parts |
| Fluorescent whitening agent (Uvitex O.B., manufactured by Ciba-Geigy) | 0.15 part |
| Toluene/methyl ethyl ketone (1/1) | 70 parts |

In this way, the sublimable dye layer region, the hot-melt ink layer region, and the transferable protective layer region were coated side by side and dried. Thereafter, an accelerated electron beam (175 kV) was applied to the coating of the coated film in a nitrogen gas atmosphere at a dose of 5 Mrad to cure, through crosslinking, the resin layer in the transferable protective layer, thereby preparing a thermal transfer film of the present invention.

EXAMPLE 3

A thermal transfer film was prepared in the same manner as in Example 2, except that the size of each sublimable dye layer region was 8 cm in length and 4 cm in width, the size of each hot-melt ink layer region was 8 cm in length and 10 cm in width, and the size of each transferable protective layer region was 8 cm in length and 4 cm in width.

EXAMPLE 4

A thermal transfer film was prepared in the same manner as in Example 2, except that an ink for an ultraviolet-screening layer was coated between the primer layer and the adhesive layer in the transferable protective layer region and dried in the same manner as used in the formation of the other layers, thereby forming an ultraviolet-screening layer.

| <Ink for ultraviolet-screening layer> | |
|---|---|
| Copolymer resin with a reactive ultraviolet absorber chemically bonded thereto (UVA-635L, manufactured by BASF Japan) | 20 parts |
| Toluene/methyl ethyl ketone (1/1) | 80 parts |

COMPARATIVE EXAMPLE 1

A thermal transfer film was prepared in the same manner as in Example 1, except that no release protective layer was provided in the hot-melt ink layer region.

COMPARATIVE EXAMPLE 2

A thermal transfer film was prepared in the same manner as in Example 3, except that, in the hot-melt ink layer region, no release protective layer was provided, that, in the transferable protective layer region, no primer layer was provided and, instead of the ionizing radiation-curable layer, a transferable protective layer was formed using the following ink, and that no curing treatment by ionizing radiation irradiation treatment was carried out.

| <Ink for transferable protective layer> | |
|---|---|
| Acrylic resin (BR-83, manufactured by Mitsubishi Rayon Co., Ltd.) | 30 parts |
| Polyethylene wax | 1.5 parts |
| Toluene/methyl ethyl ketone (1/1) | 70 parts |

A card substrate (5.5 cm in length×9 cm in width) comprising 100 parts of a polyvinyl chloride (degree of polymerization 800) containing about 10% of an additive such as a stabilizer, 10 parts of a white pigment (titanium oxide), and 0.5 part of a plasticizer (DOP) was prepared as an object on which an image is to be printed using the thermal transfer films prepared in the above examples and comparative examples.

The thermal transfer film was put on the back side of the card, and thermal energy was applied thereto by means of a thermal head in response to electric signals obtained by color separation of a photograph of a person's face to form a full-color photograph-like image of a person's face having a size of 3 cm×3 cm.

Further, as shown in FIG. 6, letters and symbols were formed on the side of and below the image of face by transfer of the hot-melt ink layer region.

For the thermal transfer films prepared in Examples 2 and 4, the protective layer was transferred so as to cover the whole surface of the face image portion and the letter and symbol portions. On the other hand, for the thermal transfer films prepared in Examples 3 and Comparative Example 2, the protective layer was transferred to cover the face image portion only.

The cards having a transferred image thus obtained were tested as follows.

Plasticizer Resistance Test

An India rubber was placed on the card, and a load of 30 g/$cm^2$ was applied thereto. In this state, the card was allowed to stand at 60° C. for 10 hr.

O: No dropout of image observed

X: Dropout of image observed

Abrasion Resistance Test

The card was rubbed 1000 times with a card surface abrasion tester.

O: Neither coming-off of color nor surface scratch observed in the face image, letters, and symbols X: Coming-off of color and/or surface scratch observed in the face image, letters, and symbols Light Resistance Test The card was exposed to light using a xenon fadeometer (Ci35A, manufactured by Atlas) under conditions of 45° C. (black panel temperature) and 200 kJ/$m^2$, and the retention of the image at a reflection density of about 1.0 was measured.

O: Retention of not less than 80% to less than 95%

X: Retention of not less than 60% to less than 80%

Test results are given in Table 1.

TABLE 1

| | Plasticizer resistance test | | Abrasion resistance test | | Light-fastness test |
|---|---|---|---|---|---|
| | Letter portion | Face image portion | Letter portion | Face image portion | Face image portion |
| Example 1 | ○ | x | ○ | x | Δ |
| Example 2 | ○ | ○ | ○ | ○ | Δ |
| Example 3 | ○ | ○ | ○ | ○ | Δ |
| Example 4 | ○ | ○ | ○ | ○ | ○ |
| Comparative Example 1 | x | x | x | x | Δ |
| Comparative Example 2 | x | x | x | ○ | Δ |

As is apparent from the foregoing description, according to the thermal transfer film of the present invention, since each dye layer region and a protective layer region are formed according to the layout of an image-receiving object, such as a card, the formation of a gradational image by sublimation transfer and the formation of a monotonous image can be carried out in a cost-effective and efficient manner.

Further, since a hot-melt ink layer region comprises a release layer, a release protective layer, and a hot-melt ink layer provided in that order on a substrate film, a release protective layer can be transferred on the surface of a monotonous image, enabling a monotonous image having excellent abrasion resistance to be formed.

What is claimed is:

1. A thermal transfer film comprising: a substrate film; a sublimable dye layer region comprised of at least one color layer; and a hot-melt ink layer region, the sublimable dye layer region and the hot-melt ink layer region being provided in parallel to each other on the substrate film, the hot-melt ink layer region comprising at least a release layer, a release protective layer, and a hot-melt ink layer laminated in that order on the substrate film, the hot-melt ink layer region being broader than one color layer in the sublimable dye layer region.

2. The thermal transfer film according to claim 1, which further comprises a transferable protective layer region provided in parallel to the sublimable layer region and the hot-melt ink layer on the substrate film.

3. The thermal transfer film according to claim 2, wherein the transferable protective layer has the same size as the at least one color layer.

4. The thermal transfer film according to claim 2, wherein the transferable protective layer region has the same area as the hot-melt ink layer region.

5. The thermal transfer film according to claim 2, wherein the transferable protective layer region comprises at least a release layer, a release protective layer, and an adhesive layer laminated in that order on the substrate film.

6. The thermal transfer film according to claim 5, wherein the release protective layer is formed of an ionizing radiation-cured resin.

7. The thermal transfer film according to claim 5, wherein a layer containing a resin with a reactive ultraviolet absorber chemically bonded thereto is provided between the release protective layer and the adhesive layer in the transferable protective layer region.

* * * * *